US010186453B2

(12) United States Patent
Liu et al.

(10) Patent No.: US 10,186,453 B2
(45) Date of Patent: Jan. 22, 2019

(54) SEMICONDUCTOR STRUCTURE AND PROCESS THEREOF

(71) Applicant: UNITED MICROELECTRONICS CORP., Hsin-Chu (TW)

(72) Inventors: Wei-Hsin Liu, Changhua County (TW); Bin-Siang Tsai, Changhua County (TW)

(73) Assignee: UNITED MICORELECTRONICS CORP., Hsin-Chu (TW)

( * ) Notice: Subject to any disclaimer, the term of this patent is extended or adjusted under 35 U.S.C. 154(b) by 27 days.

(21) Appl. No.: 14/738,943

(22) Filed: Jun. 15, 2015

(65) Prior Publication Data

US 2016/0365315 A1 Dec. 15, 2016

(51) Int. Cl.
| | |
|---|---|
| H01L 21/768 | (2006.01) |
| H01L 23/522 | (2006.01) |
| H01L 21/02 | (2006.01) |
| H01L 21/311 | (2006.01) |
| H01L 21/32 | (2006.01) |
| H01L 23/532 | (2006.01) |
| H01L 21/3105 | (2006.01) |
| H01L 23/485 | (2006.01) |

(52) U.S. Cl.
CPC ...... *H01L 21/7682* (2013.01); *H01L 21/0217* (2013.01); *H01L 21/02274* (2013.01); *H01L 21/02348* (2013.01); *H01L 21/31111* (2013.01); *H01L 21/32* (2013.01); *H01L 21/76825* (2013.01); *H01L 21/76834* (2013.01); *H01L 23/5222* (2013.01); *H01L 23/5226* (2013.01); *H01L 23/53295* (2013.01); *H01L 21/3105* (2013.01); *H01L 23/485* (2013.01); *H01L 23/53238* (2013.01)

(58) Field of Classification Search
CPC ............. H01L 23/5225; H01L 21/7682; H01L 21/76825; H01L 21/76877; H01L 23/5329; H01L 23/53295; H01L 23/5222; H01L 21/76834; H01L 21/02274; H01L 21/0217; H01L 21/31111; H01L 21/02348; H01L 21/32; H01L 23/5226; H01L 23/53238; H01L 23/485; H01L 21/3105
USPC ........................................................ 257/774
See application file for complete search history.

(56) References Cited

U.S. PATENT DOCUMENTS

| | | | |
|---|---|---|---|
| 5,641,712 A | 6/1997 | Grivna | |
| 5,739,579 A * | 4/1998 | Chiang | ............. H01L 21/76801 257/635 |
| 5,759,913 A | 6/1998 | Fulford, Jr. | |
| 6,429,128 B1 * | 8/2002 | Besser | ................ H01L 21/3185 257/E21.293 |

(Continued)

*Primary Examiner* — Yasser A Abdelaziez
(74) *Attorney, Agent, or Firm* — Winston Hsu

(57) ABSTRACT

A semiconductor process includes the following steps. Metal patterns are formed on a first dielectric layer. A modifiable layer is formed to cover the metal patterns and the first dielectric layer. A modification process is performed to modify a part of the modifiable layer on top sides of the metal patterns, thereby top masks being formed. A removing process is performed to remove a part of the modifiable layer on sidewalls of the metal patterns but preserve the top masks. A dielectric layer having voids under the top masks and between the metal patterns is formed. Moreover, the present invention also provides a semiconductor structure formed by said semiconductor process.

4 Claims, 5 Drawing Sheets

(56) References Cited

U.S. PATENT DOCUMENTS

| | | | |
|---|---|---|---|
| 7,501,355 B2* | 3/2009 | Bhatia | H01L 21/0332 |
| | | | 257/E21.263 |
| 7,973,409 B2 | 7/2011 | Yang | |
| 2002/0149085 A1 | 10/2002 | Lin | |
| 2008/0124917 A1* | 5/2008 | Oh | H01L 21/7682 |
| | | | 438/637 |
| 2009/0104571 A1 | 4/2009 | Liu | |
| 2010/0015813 A1 | 1/2010 | Mcginnis | |
| 2010/0093168 A1 | 4/2010 | Naik | |
| 2011/0298070 A1* | 12/2011 | Fukui | H01L 43/12 |
| | | | 257/422 |
| 2012/0217622 A1* | 8/2012 | Bedell | H01L 21/78 |
| | | | 257/632 |
| 2014/0252620 A1* | 9/2014 | Huang | H01L 23/53238 |
| | | | 257/751 |
| 2015/0054054 A1* | 2/2015 | Ahn | H01L 29/66825 |
| | | | 257/321 |
| 2015/0108652 A1* | 4/2015 | Hong | H01L 21/76879 |
| | | | 257/773 |

* cited by examiner

SEMICONDUCTOR STRUCTURE AND PROCESS THEREOF

BACKGROUND OF THE INVENTION

1. Field of the Invention

The present invention relates generally to a semiconductor structure and process thereof, and more specifically to a semiconductor structure applying air gaps in a dielectric layer and process thereof.

2. Description of the Prior Art

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, widths of conductive lines and spacing between the conductive lines of interconnect structures also need to be scaled smaller.

A move is being made away from traditional materials used in the past in semiconductor device designs, in order to meet these demands. To reduce an RC time delay, low dielectric constant (low-k) materials are being used as insulating materials, and there is a switch being made to the use of copper for interconnect materials, rather than aluminum. Copper interconnects are often formed using damascene processes rather than by direct etching. Damascene processes are typically either single or dual damascene, which includes forming openings by patterning and etching inter-metal dielectric (IMD) layers and filling the openings with copper. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay.

As the integration of integrated circuits develops, interconnects either copper interconnects or aluminum interconnects are required to be improved accordingly for enhancing result device qualification.

SUMMARY OF THE INVENTION

The present invention provides a semiconductor structure and process thereof, which applies air gaps in a dielectric layer between metal patterns such as interconnects to reduce capacitance between metal patterns, reduce RC delay and increase circuit speed.

The present invention provides a semiconductor process including the following steps. Metal patterns are formed on a first dielectric layer. A modifiable layer is formed to cover the metal patterns and the first dielectric layer. A modification process is performed to modify a part of the modifiable layer on top sides of the metal patterns, thereby top masks being formed. A removing process is performed to remove a part of the modifiable layer on sidewalls of the metal patterns but preserve the top masks. A dielectric layer having voids under the top masks and between the metal patterns is formed.

The present invention provides a semiconductor structure including metal patterns and top masks. The metal patterns are disposed in a dielectric layer, wherein the dielectric layer has voids between the metal patterns, and the dielectric layer directly contacts sidewalls of the metal patterns. The top masks are directly disposed on the metal patterns.

According to the above, the present invention provides a semiconductor structure and process thereof, which forms a modifiable layer to cover metal patterns and a first dielectric layer below the metal patterns; performs a modification process to modify a part of the modifiable layer on top sides of the metal patterns; performs a removing process to remove a part of modifiable layer on sidewalls of the metal patterns; and then, forms a dielectric layer having voids between the metal patterns. In this way, capacitance between the metal patterns can be reduced, RC delay of a formed semiconductor component can be reduced, and circuit speed of a formed semiconductor component can be increased.

These and other objectives of the present invention will no doubt become obvious to those of ordinary skill in the art after reading the following detailed description of the preferred embodiment that is illustrated in the various figures and drawings.

DETAILED DESCRIPTION

The present invention is applied in a planar transistor in this embodiment, but the present invention can also be applied in a non-planar transistor such as a multi-gate MOSFET, depending upon practical requirements.

Figure 1:
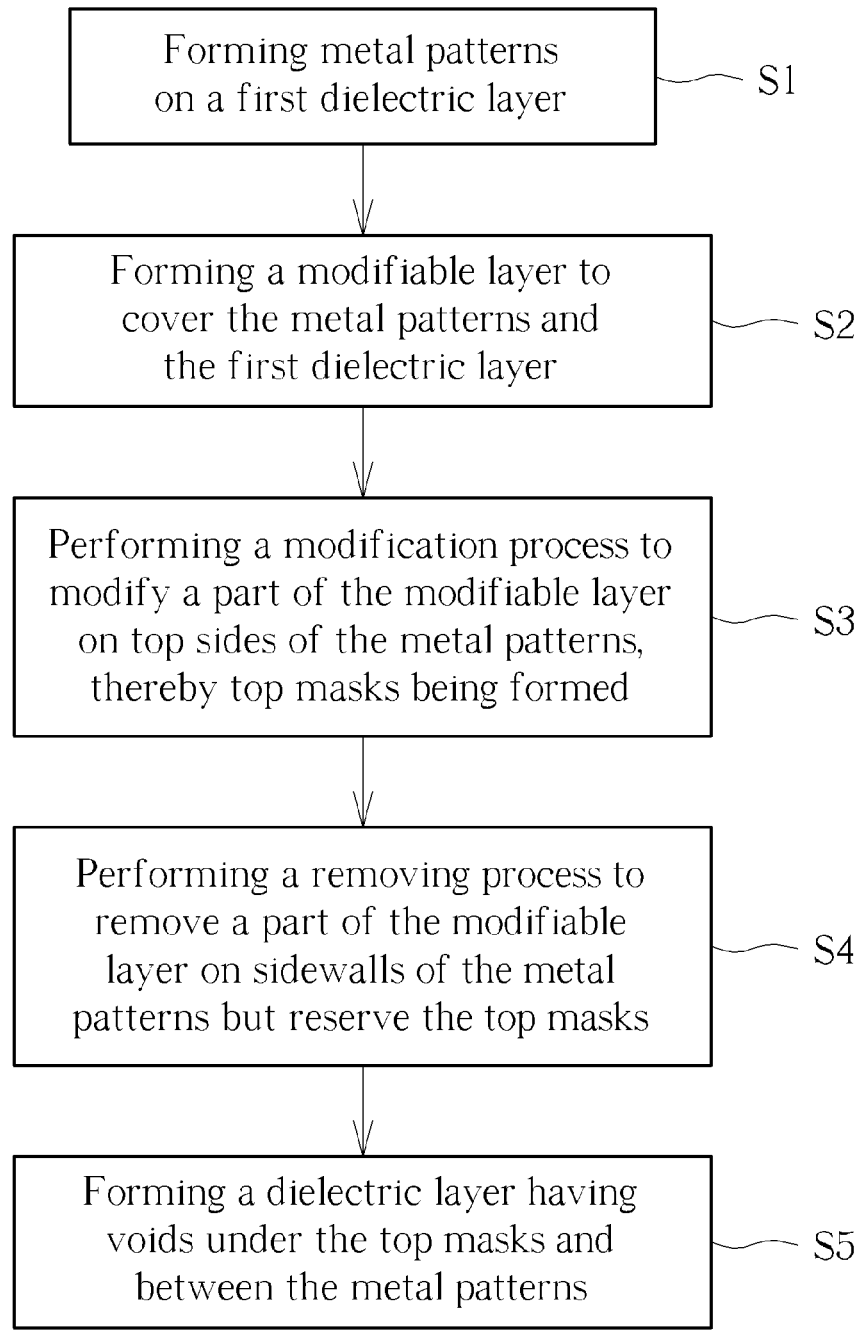
FIG. 1 schematically depicts a flow chart of a semiconductor process according to an embodiment of the present invention.

FIG. 1 schematically depicts a flow chart of a semiconductor process according to an embodiment of the present invention. FIGS. 2-8 schematically depict cross-sectional views of a semiconductor process according to an embodiment of the present invention. According to step S1 of FIG. 1—forming metal patterns on a first dielectric layer, please refer to FIGS. 2-4. In this embodiment, the first dielectric layer is an inter-level dielectric (ILD) layer having a MOS transistor formed therein, so that the metal patterns are metal interconnects in an inter-metal dielectric layer of Metal zero ($M_0$) directly on the inter-level dielectric layer, but the present invention is not restricted to be applied thereto. In other embodiments, the present invention may be used in other inter-metal dielectric layers such as an inter-metal dielectric layer of Metal one ($M_1$), Metal two ($M_2$) or others disposed above the inter-metal dielectric layer of Metal zero ($M_0$).

Figure 2:
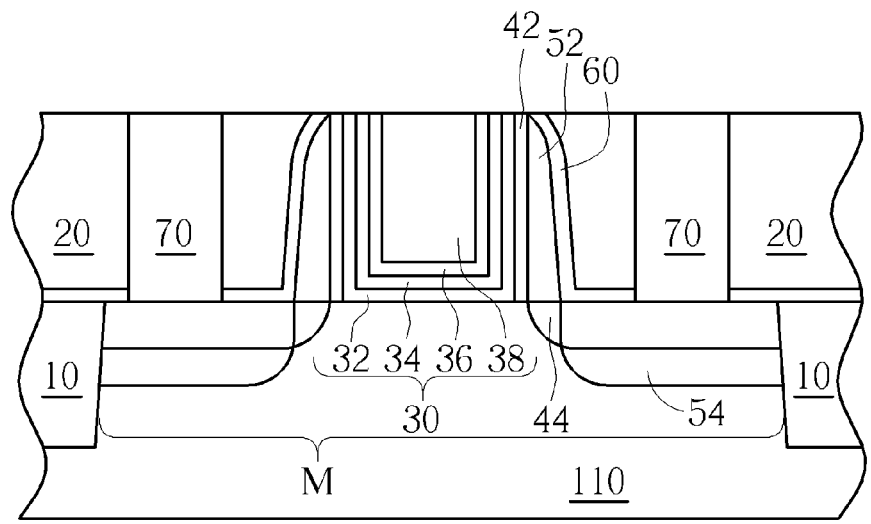
FIGS. 2-8 schematically depict cross-sectional views of a semiconductor process according to an embodiment of the present invention.

Thus, as shown in FIG. 2, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Isolation structures 10 formed in the substrate 110 to electrically isolate each transistor may be in a same or different areas. The isolation structures 10 may be shallow trench isolation (STI) structures, which may be formed by a shallow trench isolation process, and the forming method is known in the art, and will not be described herein, but it is not limited thereto.

A first dielectric layer 20 having a MOS transistor M therein is formed on the substrate 110. The first dielectric layer 20 is an inter-level dielectric (ILD) layer said previously. The first dielectric layer 20 may be composed of silicon oxycarbide (SiOC), ultra-low k dielectric materials, or others. In this case, the MOS transistor M has a metal gate 30, but it is not limited thereto. In other cases, the MOS transistor M may have a polysilicon gate, depending upon practical requirements. The metal gate 30 may include a selective buffer layer (not shown), a dielectric layer having a high dielectric constant 32, a barrier layer 34, a work function layer 36 and a low resistivity material 38. Since a gate-last for high-K last process is applied in this embodiment, the selective buffer layer (not shown), the dielectric layer having a high dielectric constant 32, the barrier layer 34, the work function layer 36 and the low resistivity material 38 all have U-shaped cross-sectional profiles, but it is not limited thereto. In other embodiments, a gate-last for high-K first process, agate first process, a polysilicon gate process or other semiconductor processes may be applied instead. The method of forming the metal gate 30 such as a replacement metal gate (RMG) process is well-known in the art, and is not descried herein.

The selective buffer layer may be an oxide layer, which may be a thermal oxide process or a chemical oxide process; the dielectric layer having a high dielectric constant 32 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1\text{-}xO_3$, PZT) and barium strontium titanate ($Ba_xSr_1\text{-}xTiO_3$, BST); the barrier layer 34 may be a single layer or a stacked structure composed of titanium nitride (TiN) or tantalum nitride (TaN); the work function layer 36 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN); and the low resistivity material 38 may be composed of low resistivity materials such as aluminum, tungsten, titanium aluminum (TiAl) alloy, cobalt tungsten phosphide (CoWP), but the present invention is not restricted thereto.

Furthermore, a spacer 42 may be formed on the substrate 110 beside the metal gate 30 to define the position of a lightly doped source/drain in the substrate 110 beside the spacer 42. A lightly doped source/drain 44 is then formed in the substrate 110 beside the spacer 42. Then, a main spacer 52 may be formed on the substrate 110 beside the spacer 42. A source/drain 54 is formed in the substrate 110 beside each of the main spacer 52. A contact etch stop layer 60 may be formed to cover the metal gate 30 and the substrate 110. Two contact plugs 70 are formed in the first dielectric layer 20 and directly contact the source/drain 54 to electrically connect the source/drain 54 outwards.

In this embodiment, the spacer 42 and the main spacer 52 are both single layers. In other embodiments, the spacer 42 and the main spacer 52 may be multilayer spacers, and their cross-sectional profiles depend upon practical needs and processing steps. The dopants of the lightly doped source/drain 44 and the source/drain 54 may be trivalent ions such as boron or pentavalent ions such as phosphorus with different dopant concentrations, depending upon practical needs. The contact etch stop layer 60 may be an un-doped nitride layer, a doped nitride layer, or others. The contact plugs 70 may include barrier layers and main conductive materials, or others. Methods of forming these components are known in the art and are not described herein.

Then, a cap layer 80 may optionally and blanketly cover the metal gate 30, the contact plugs 70 and the first dielectric layer 20 to prevent the metal gate 30, the contact plugs 70 and the first dielectric layer 20 from being damaged. The cap layer 80 may be composed of silicon oxynitride (SiON), or others.

Figure 3:
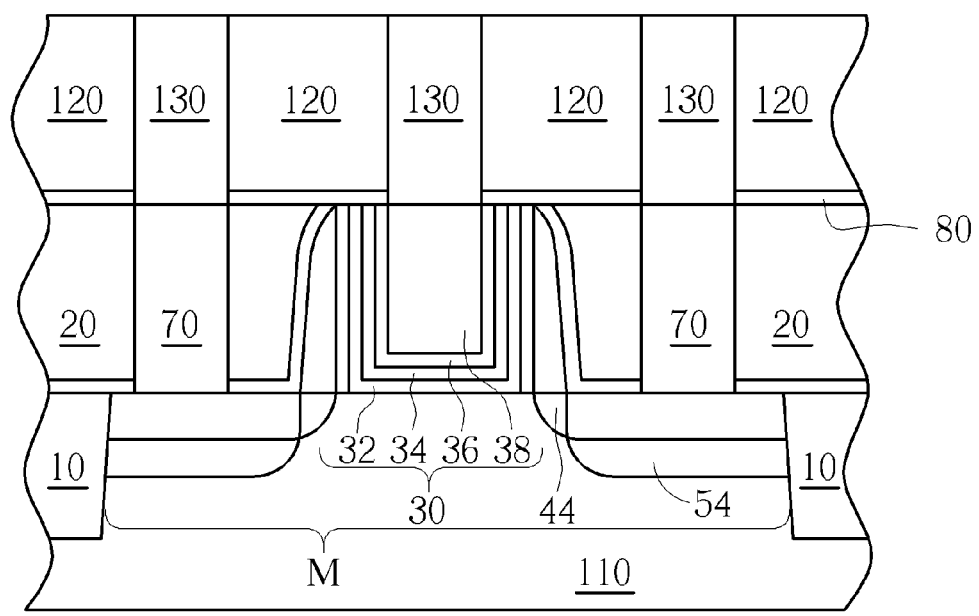
Figure 4:
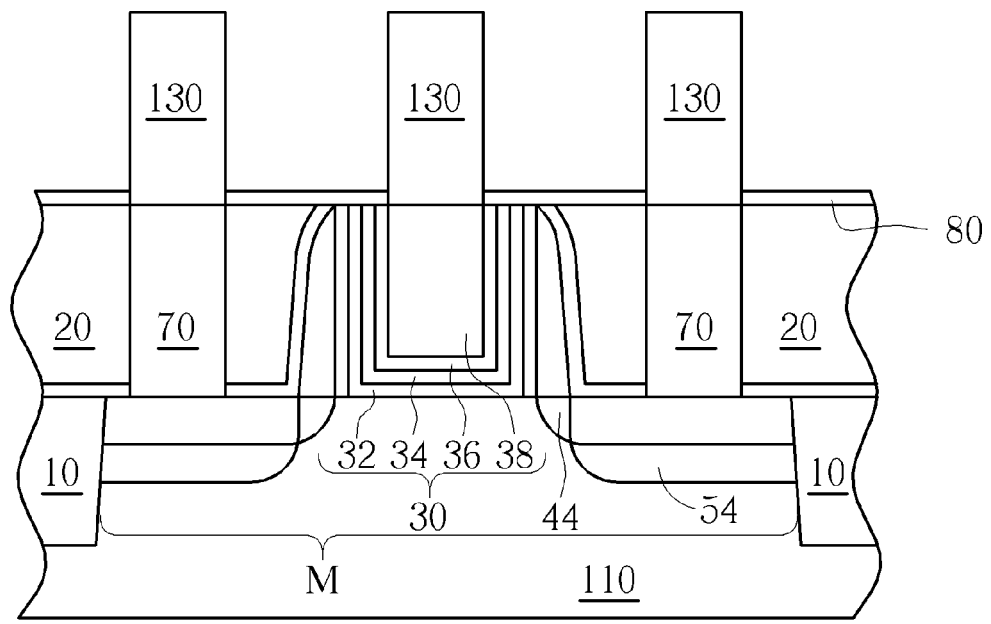

As shown in FIG. 3, a dielectric layer 120 having metal patterns 130 therein are formed on the first dielectric layer 20, which may be carried out by processes such as a dual damascene process, but it is not limited thereto. More precisely, a dielectric layer (not shown) is formed directly on the cap layer 80 and then the dielectric layer is patterned to form three recesses (not shown) to expose the metal gate 30 and the contact plugs 70 respectively; thereafter, the metal patterns 130 fill in the recesses. In this embodiment, the dielectric layer 120 is an oxide layer, while the metal patterns 130 are metal interconnects such as copper interconnects, but it is not limited thereto. In other embodiments, the metal interconnects may be aluminum interconnects. Thereafter, the dielectric layer 120 is removed, as shown in FIG. 4. Thereby, the metal patterns 130 on the first dielectric layer 20 are complete. Each metal patterns 130 may include a barrier layer (not shown) surrounding a main conductive material (not shown).

Figure 5:
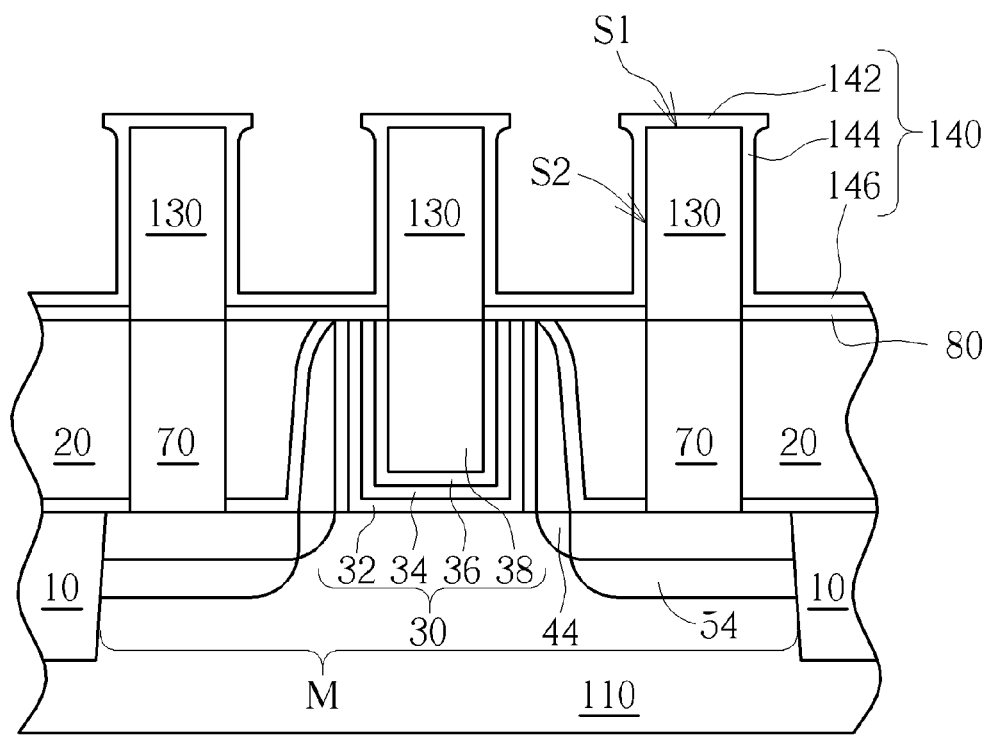

According to step S2 of FIG. 1—forming a modifiable layer to cover the metal patterns and the first dielectric layer, please refer to FIG. 5. A modifiable layer 140 covers the metal patterns 130 and the first dielectric layer 20 (or the cap layer 80). The modifiable layer 140 may be a silicon nitride layer, a stress silicon nitride layer, or others. In a preferred embodiment, the modifiable layer 140 is a non-ultraviolet treated silicon nitride layer and the modifiable layer 140 is formed by a plasma enhanced chemical vapor deposition (PECVD) process, but it is not limited thereto. It is noted that, the modifiable layer 140 has top parts 142 on top sides S1 of the metal patterns 130, sidewall parts 144 on sidewalls S2 of the metal patterns 130, and bottom parts 146 on the first dielectric layer 20 (or the cap layer 80) and connecting the sidewall parts 144.

Figure 6:
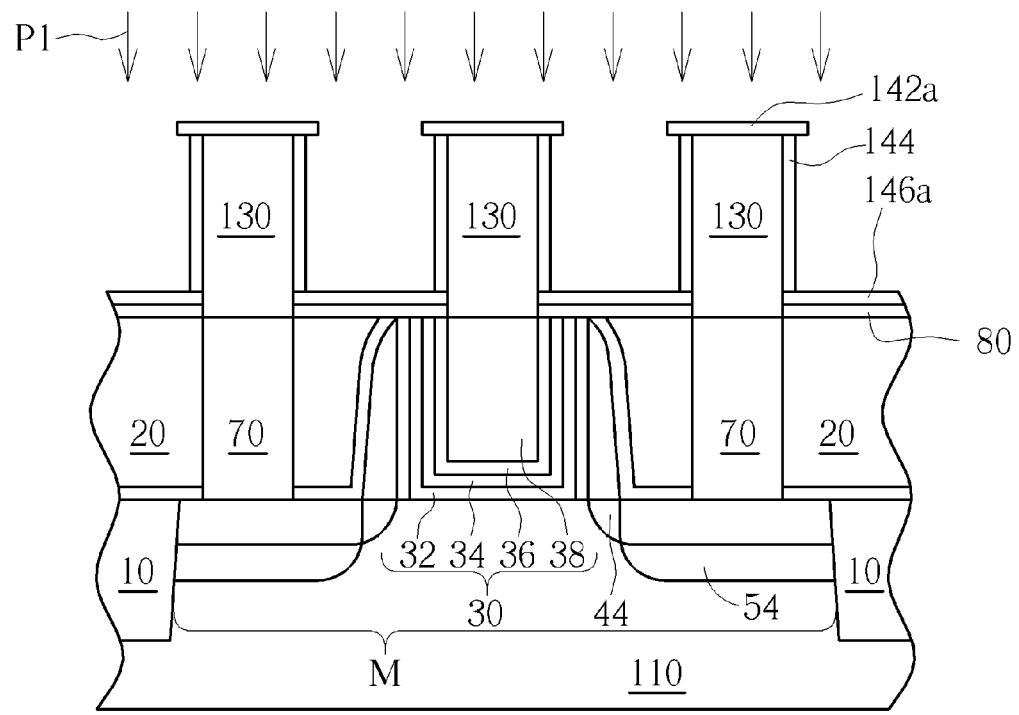

According to step S3 of FIG. 1—performing a modification process to modify a part of the modifiable layer on top sides of the metal patterns, thereby top masks being formed, please refer to FIG. 6. A modification process P1 is performed to modify the top parts 142 of the modifiable layer 140 and the bottom parts 146 of the modifiable layer 140, thereby forming top masks 142a and bottom masks 146a. Since the top masks 142a and the bottom masks 146a are both modified by one same modification process P1, they are composed of a same material. In a preferred embodiment, the modification process P1 is a curing process; in a still preferred embodiment, the modification process is an ultraviolet curing process, thereby the modifiable layer 140 may become an ultraviolet treated silicon nitride layer, but it is not limited thereto. Additionally, the modification process P1 may be a doping process or others. Since the sidewall parts 144 of the modifiable layer 140 are shadowed by the top parts 142, the sidewall parts 144 are not modified. In this embodiment, the top parts 142 and the bottom parts 146 are modified without modifying the sidewall parts 144. In addition, only the top parts 142 may be modified without modifying the bottom parts 146 and the sidewall parts 144. In the present invention, the top parts 142 must be modified for removing the sidewall parts 144.

Figure 7:
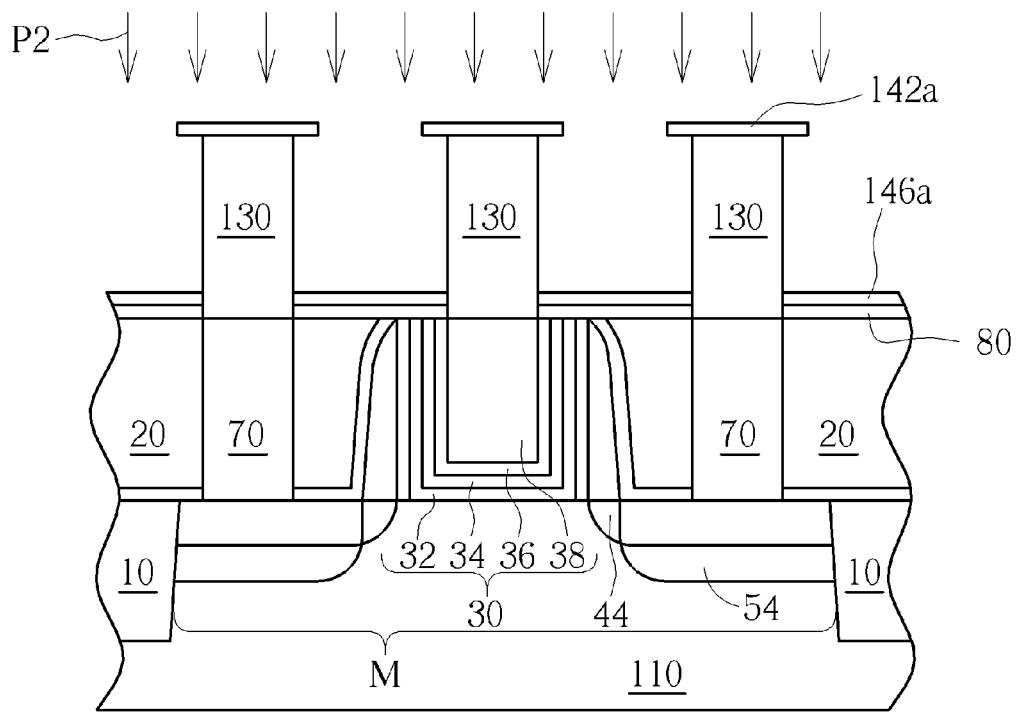

According to step S4 of FIG. 1—performing a removing process to remove a part of the modifiable layer on sidewalls of the metal patterns but preserve the top masks, please refer to FIG. 7. A removing process P2 is performed to remove the sidewall parts 144. Preferably, the removing process P2 is a wet etching process; still preferably, the etchant of the wet etching process may include phosphoric acid or diluted hydrofluoric acid, but it is not limited thereto. Since the top parts 142 and the bottom parts 146 are modified to form the top masks 142a and the bottom masks 146a without modifying the sidewall parts 144, the top masks 142a and the bottom masks 146a are preserved while the sidewall parts 144 are removed.

Figure 8:
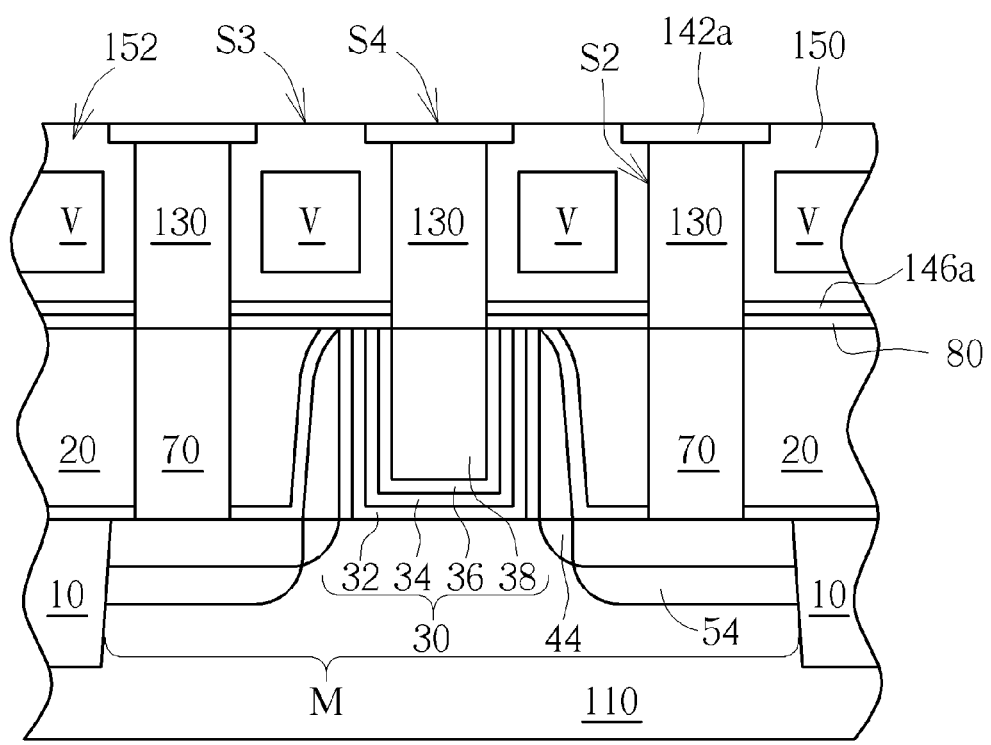

According to step S5 of FIG. 1—forming a dielectric layer having voids under the top masks and between the metal patterns, please refer to FIG. 8. A dielectric layer 150 is formed between the metal patterns 130, under the top masks 142a and on the bottom masks 146a. More precisely, a dielectric layer (not shown) may fill between and cover the metal patterns 130 and is planarized by processes such as a chemical mechanical polishing (CMP) process, so that the dielectric layer 150 can be formed, where a top surface S3 of the dielectric layer 150 is trimmed with top surfaces S4 of the top masks 142a.

It is emphasized that, the dielectric layer 150 directly contacts the sidewalls S2 of the metal patterns 130, the top masks 142a and the bottom masks 146a. Besides, the dielectric layer 150 has voids V between the metal patterns 130. In this embodiment, the dielectric layer 150 is an inter-metal dielectric layer, but it is not limited thereto. The dielectric layer 150 may be composed of silicon oxycarbide (SiOC), ultra-low k dielectric materials, or others.

In the present invention, since the sidewall parts 144 are removed and the dielectric layer 150 directly contacts the sidewalls S2 of the metal patterns 130, sizes of the voids V can be larger than the sizes of the voids without removing the sidewall parts 144 of the modifiable layer 140. Thereby, capacitance between the metal patterns 130 cab be reduced and the RC delay time can be reduced due to the dielectric constant of the voids V being lower than the dielectric constant of the dielectric layer 150. Hence, this increases circuit speed of a formed semiconductor component.

Thereafter, a curing process (not shown) may be optionally performed after the dielectric layer 150 having voids V between the metal patterns 130 is formed, to densify top parts 152 of the dielectric layer 150 and eliminate holes, which may generate in the top parts 152, thereby sealing the voids V in advance.

Above all, the present invention is applied in the metal patterns 130 in this embodiment. The present invention, however, may be applied in other non-metal patterns for similar structures or purposes in other embodiments.

To summarize, the present invention provides a semiconductor structure and process thereof, which forms a modifiable layer to cover metal patterns and a first dielectric layer below the metal patterns; performs a modification process to modify a part of the modifiable layer on top sides of the metal patterns; performs a removing process to remove apart of modifiable layer on sidewalls of the metal patterns; and then, forms a dielectric layer having voids between the metal patterns. In this way, capacitance between the metal patterns can be reduced and RC delay can be reduced because of lower dielectric constant between the metal patterns, and thus increasing circuit speed of a formed semiconductor component.

Moreover, the modifiable layer may be a silicon nitride layer, a stress silicon nitride layer, even an un-ultraviolet treated silicon nitride layer, or others. The modification process may be a curing process, preferably an ultraviolet curing process, etc. The removing process may be a wet etching process, which preferably contains etchant of phosphoric acid or diluted hydrofluoric acid, or others.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   metal patterns comprising metal interconnects disposed in a dielectric layer, wherein the dielectric layer has voids between the metal patterns, and the dielectric layer directly contacts sidewalls of the metal patterns;
   top masks being ultraviolet treated silicon nitride layers directly disposed on the metal patterns, wherein two ends of the top masks protrude laterally from and above the metal patterns, and the top masks are separated from each other;
   a first dielectric layer located below the metal patterns and the dielectric layer; and
   bottom masks on the first dielectric layer and between the metal patterns.

2. The semiconductor structure according to claim 1, wherein the dielectric layer comprises an inter-metal dielectric layer.

3. The semiconductor structure according to claim 1, wherein the top masks and the bottom masks are composed of a same material.

4. The semiconductor structure according to claim 1, wherein the top masks have top surfaces trimmed with a top surface of the dielectric layer.

* * * * *

UNITED STATES PATENT AND TRADEMARK OFFICE
CERTIFICATE OF CORRECTION

PATENT NO.        : 10,186,453 B2
APPLICATION NO.   : 14/738943
DATED             : January 22, 2019
INVENTOR(S)       : Wei-Hsin Liu et al.

Page 1 of 1

It is certified that error appears in the above-identified patent and that said Letters Patent is hereby corrected as shown below:

On the Title Page

Item (73), correct the name of the assignee from "UNITED MICORELECTRONICS CORP." to --UNITED MICROELECTRONICS CORP.--.

Signed and Sealed this
Ninth Day of April, 2019

Andrei Iancu
*Director of the United States Patent and Trademark Office*